(12) United States Patent
Abe

(10) Patent No.: US 6,815,645 B2
(45) Date of Patent: Nov. 9, 2004

(54) HEAT REFLECTING MATERIAL AND HEATING DEVICE USING THE MATERIAL

(75) Inventor: Takao Abe, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/469,765
(22) PCT Filed: Jan. 31, 2002
(86) PCT No.: PCT/JP02/00754
§ 371 (c)(1), (2), (4) Date: Sep. 4, 2003
(87) PCT Pub. No.: WO02/072343
PCT Pub. Date: Sep. 19, 2002

(65) Prior Publication Data
US 2004/0092088 A1 May 13, 2004

(30) Foreign Application Priority Data
Mar. 8, 2001 (JP) .......................... 2001-65678

(51) Int. Cl.[7] .................. H01L 21/324; H01L 21/22; F21V 7/10; F27D 11/02; F27B 5/14
(52) U.S. Cl. .................. 219/405; 219/390; 362/308
(58) Field of Search ................. 219/390, 405; 392/422; 362/296, 297, 308

(56) References Cited

U.S. PATENT DOCUMENTS

| | | | | |
|---|---|---|---|---|
| 4,081,667 A | * | 3/1978 | Lewin et al. | 362/296 |
| 4,112,483 A | * | 9/1978 | Small et al. | 362/297 |
| 5,844,638 A | * | 12/1998 | Ooi et al. | 362/308 |
| 6,035,100 A | * | 3/2000 | Bierman et al. | 118/50.1 |
| 6,054,687 A | * | 4/2000 | Conner et al. | 219/405 |
| 6,226,453 B1 | * | 5/2001 | Yam et al. | 219/390 |

FOREIGN PATENT DOCUMENTS

| | | |
|---|---|---|
| JP | 62-152112 | 9/1987 |
| JP | 4-116129 | 10/1992 |
| JP | 8-133792 | 5/1996 |
| JP | 2000-34557 | 2/2000 |

* cited by examiner

Primary Examiner—Joseph M Pelham
(74) Attorney, Agent, or Firm—Snider & Associates; Ronald R. Snider (57) ABSTRACT

A heating apparatus 20 comprises a container 2 having a work housing space 1 formed therein, and a heat source 3 for heating a work W in the work housing space 1. The apparatus further comprises a heat ray reflecting member 10 having a heat reflecting surface 10a thereof composed of a heat ray reflecting material, so as to allow the heat ray generated in the work housing space 1 to reflect on the heat reflecting surface 10a to thereby change the direction thereof towards the works W. The heat reflecting material is provided for reflecting heat ray in a specific wavelength band, comprises a stack of a plurality of element reflecting layers comprising materials having transparent properties to the heat ray, in which in the element reflecting layers, two adjacent layers are composed of a combination of materials differed from each other in refractive indices to the heat ray, while keeping difference between the refractive indices of 1.1 or larger.

39 Claims, 9 Drawing Sheets

PROCESS STEP (a)

PROCESS STEP (b)

PROCESS STEP (c)

PROCESS STEP (d)

HEAT REFLECTING MATERIAL AND HEATING DEVICE USING THE MATERIAL

TECHNICAL FIELD

This invention relates to a heat ray reflecting material capable of efficiently reflecting heat ray radiated from an exothermic body, and a heating apparatus using the same.

BACKGROUND ART

Manufacturing process for semiconductor wafers and device fabrication process using the semiconductor wafers include processes in which the semiconductor wafers are heated to several-hundred to thousand-and-several-hundred degree centigrade, and for which a various types of annealing furnaces such as those based on resistance heating system (heater heating system), lamp heating system and so forth are used depending on purposes.

For example, in order to manufacture a silicon single crystal wafer, which is a representative semiconductor wafer, a silicon single crystal ingot is pulled using a single crystal pulling apparatus. In the pulling of the single crystal ingot, a quartz crucible in which polysilicon is charged is surrounded by a heater, and the crucible is heated to a temperature as high as 1,420° C. so as to fuse the polysilicon as a source material. After the silicon single crystal thus produced is processed to obtain the wafers, removal of damage, diffusion of impurities, vapor phase growth of semiconductor films and so forth are also carried out under heated atmosphere, where a variety of heating apparatuses are used therefor. Also in the field of compound semiconductor, heating apparatuses are used for vapor phase growth or liquid phase growth of semiconductor films, and other annealing processes.

In order to raise the heating efficiency, the annealing apparatuses used for the above-described annealing are generally configured so that heat insulating materials are disposed around the exothermic body such as the aforementioned heater or lamp so as to prevent heat from dissipating to the externals. In more simplified heating apparatuses, the heat insulating material may sometimes omitted for size reduction.

Disposition of the heat insulating material, however, not only increases the size of the heating apparatus but also needs a longer time additionally for heating of the heat insulating material because of a large heat capacity thereof, and still also for cooling after completion of the annealing. Disposition of a forced cooling apparatus based on water cooling, air cooling or the like further increases the size of the apparatus. Moreover, heat absorbed by the heat insulating material is of course less contributable to heating of the works, and this worsens the energy efficiency. It is a matter of course that the apparatus using no heat insulating material further suffers from more waste dissipation of the energy.

A subject of this invention is therefore to provide a heat ray reflecting material capable of reflecting heat ray emitted from an exothermic body in an extremely efficient manner, and a heating apparatus capable of efficiently raising or lowering the temperature by concentrating heat ray emitted from an exothermic body towards the works by using the heat ray reflecting material.

DISCLOSURE OF THE INVENTION

To solve the aforementioned subject, a heat ray reflecting material of the invention is such as being capable of reflecting heat ray in a specific wavelength band, being a stack of a plurality of element reflecting layers comprising materials having transparent properties to the heat ray, wherein, in the element reflecting layers, two adjacent layers are composed of a combination of materials differed from each other in refractive indices to the heat ray, while keeping difference between the refractive indices of 1.1 or larger.

The heat ray reflecting material of the invention is configured based on a combination of the element reflecting layers respectively having transparent properties to the heat ray, differed from each other in refractive indices to the heat ray, and keeping difference between the refractive indices of 1.1 or larger. By composing the heat ray reflecting material based on the combination of the element reflecting layers ensuring a large difference in the refractive indices therebetween, the heat ray can be reflected at an extremely high reflectivity. Because a high reflectivity can be achieved only by a limited range of increase in the number of stacking of the element reflecting layers, the heat ray reflecting material can be manufactured at low costs. Difference in the refractive indices less than 1.1 inevitably lowers the reflectivity, and increase in the number of cycles of the stacking intended for an improved reflectivity raises the costs. The difference in the refractive indices between the element reflecting layers to be combined is preferably kept at 1.2 or more, more preferably 1.5 or more, and still more preferably 2.0 or more.

While "having transparent properties" herein can be defined as a status that an object has a property of allowing electromagnetic wave such as light to pass therethrough, transparent property in this invention is preferably such as ensuring a transmissivity of the heat ray to be reflected of as large as 80% or more for the thickness to be adopted. The transmissivity less than 80% may increase the absorption ratio of the heat ray, and may prevent the heat ray reflecting material of the invention from fully exhibiting the effect of reflecting the heat ray. The transmissivity is preferably 90% or more, and more preferably 100%. A transmissivity of 100% herein means a transmissivity which can be considered as almost 100% within a range of measurement limit (e.g., within ±1% error) in general methods of measuring transmissivity.

Next, a heating apparatus according to a first aspect of this invention comprises a container having a work housing space formed therein; a heat source for heating a work in the work housing space; and a heat ray reflecting member having a heat reflecting surface thereof composed of the heat ray reflecting material of this invention, so as to allow the heat ray generated in the work housing space to reflect on the heat reflecting surface to thereby change the direction thereof towards the work.

A heating apparatus according to a second aspect of this invention comprises at least an annealing chamber for carrying out annealing; an exothermic body disposed outside the annealing chamber; and a heat ray reflecting member surrounding the exothermic body and the annealing chamber and having a heat reflecting surface thereof composed of the heat ray reflecting material of this invention.

By applying the heat ray reflecting member composed of the heat ray reflecting material of this invention to a heating apparatus, and by using the member as a substitute, for example, for a part of or entire portion of the heat insulating material, delay in the heating or cooling speed of the annealing apparatus ascribable to heat capacity of the heat insulating material can be improved, and this enables more rapid heating and cooling as compared with those for the conventional apparatus. It is also possible to expand a length of uniform heating as compared with that for the conventional annealing apparatus. It is still also possible to achieve down-sizing and energy-saving effects of the apparatus because energy of the heat ray from the exothermic body can efficiently be concentrated to the work.

The specific wavelength band of the heat ray selected from a range of 1 to 10 μm can cover wavelength ranges of heat ray necessary for heat processing in various applications, and can promise the effect of this invention. Although applicable fields of the heating apparatus of this invention are not specifically limited, one possible example is like the followings. In order to manufacture a silicon single crystal wafer which is a representative semiconductor wafer, first a silicon single crystal ingot is pulled using a single crystal pulling apparatus. In the pulling of the single crystal ingot, a quartz crucible in which polysilicon is charged is surrounded by a heater, and the crucible is heated to a temperature as high as 1,420° C. or above. The invention is applicable to this heating apparatus. In this case, the wavelength band of the heat ray to be reflected falls within a range from 1 to 5 μm, and more preferably 1 to 3 μm, which successfully covers an essential portion of spectra of the heat ray emitted from a melt of semiconductor source material or from the heater for keeping a molten state of the semiconductor source material. This makes it possible to efficiently reflect and control the radiated infrared ray.

After the silicon single crystal thus produced is processed to obtain the wafers, removal of damage, diffusion of impurities, vapor phase growth of semiconductor films and so forth are carried out also under heated atmosphere as high as 400 to 1,400° C., for example, where the invention is applicable also to various heating apparatuses for carrying out these processes. In these cases, the wavelength band of the heat ray to be reflected falls within a range from 1 to 30 μm, and more preferably 1 to 10 μm. This makes it possible to efficiently reflect and control the heat ray from a heat source such as the heater or the like, or from the work per se heated therewith.

On the other hand, heating apparatuses are used also in the field of compound semiconductor for vapor phase growth or liquid phase growth of semiconductor films, or other annealing processes (temperature range: 400 to 1,400° C. or around), where the invention is again applicable thereto. The wavelength band of the heat ray to be reflected falls within a range from 1 to 30 μm, and more preferably 1 to 10 μm.

Moreover, heat processing is applied not only for the aforementioned semiconductor materials, but is widely applied to various materials or to a vast variety of processes. For example, various heating apparatuses are used in the manufacture of metal materials or metal members, for melting of the materials, sintering, hot working and other annealing processes (temperature range: 400 to 1,800° C. or around, wavelength band of heat ray to be reflected: 0.3 to 30 μm). Also in the manufacture of inorganic materials such as ceramics or glasses, heating apparatuses are used for sintering, processing or other annealing processes (temperature range: 700 to 1,800° C. or around, wavelength band of heat ray to be reflected: 0.3 to 20 μm). Besides these, drying furnace or the like used for various applications can be said as a kind of heating apparatus. Further besides those of industrial use, heating cooking instruments (e.g., oven) for business use or home use can be exemplified. These are used at a relatively low temperature range, for example, 200 to 500° C. or around (wavelength band of heat ray to be reflected: 3 to 40 μm).

The stack composing the heat ray reflecting member can be configured so as to include first and second element reflecting layers differed in refractive indices and being adjacent to each other, and so that stack cycle units, each of which comprising a first and a second element reflecting layers, are formed in two or more cycles on the surface of a base member. The periodic changes in the refractive index of the stack in the thickness-wise direction thereof is successful in further raising the heat ray reflectivity. In this case, a larger difference in the refractive indices of the plurality of materials composing the stack cycle units can result in a larger reflectivity. For example, the simplest constitution of the stack cycle unit relates to a two-layered structure comprising the first element reflecting layer and the second element reflecting layer differed in the refractive indices to the heat ray from each other. In this case, a larger difference between the refractive indices of both layers can reduce the number of the stack cycle units necessary for keeping the reflectivity of heat ray at a sufficiently high level. The number of layers composing the stack cycle unit may be three or more.

The thickness of the stack cycle unit can be set smaller than the central wavelength of the heat ray to be reflected. This setting is successful in the formation of an optical stop band structure (or one-dimensional photonic band gap structure) against the heat ray of a specific wavelength band in the thickness-wise direction of the heat reflecting layer depending on the distribution of refractive indices in the stack cycle units, and this makes it possible to almost completely reflect the heat ray of such specific wavelength band to thereby fully extract the aforementioned effects of the invention. The thickness of the individual layers and the number of cycles can be determined by calculations or experiments based on a range of the wavelength band to be reflected. Adoption of the combination of the materials differed in the refractive indices by 1.1 or more as in the invention is successful in readily realizing the stack cycle structure having a heat ray reflectivity close to complete reflection with a relatively small number of formation cycles of the stack cycle unit, or more specifically 5 cycles or less. In particular, adoption of a combination ensuring a difference in the refractive indices of 1.5 or more is successful in realizing a large heat ray reflectivity as described in the above only with the number of formation cycles of 4 cycles, 3 cycles or even as small as 2 cycles.

Figure 8:
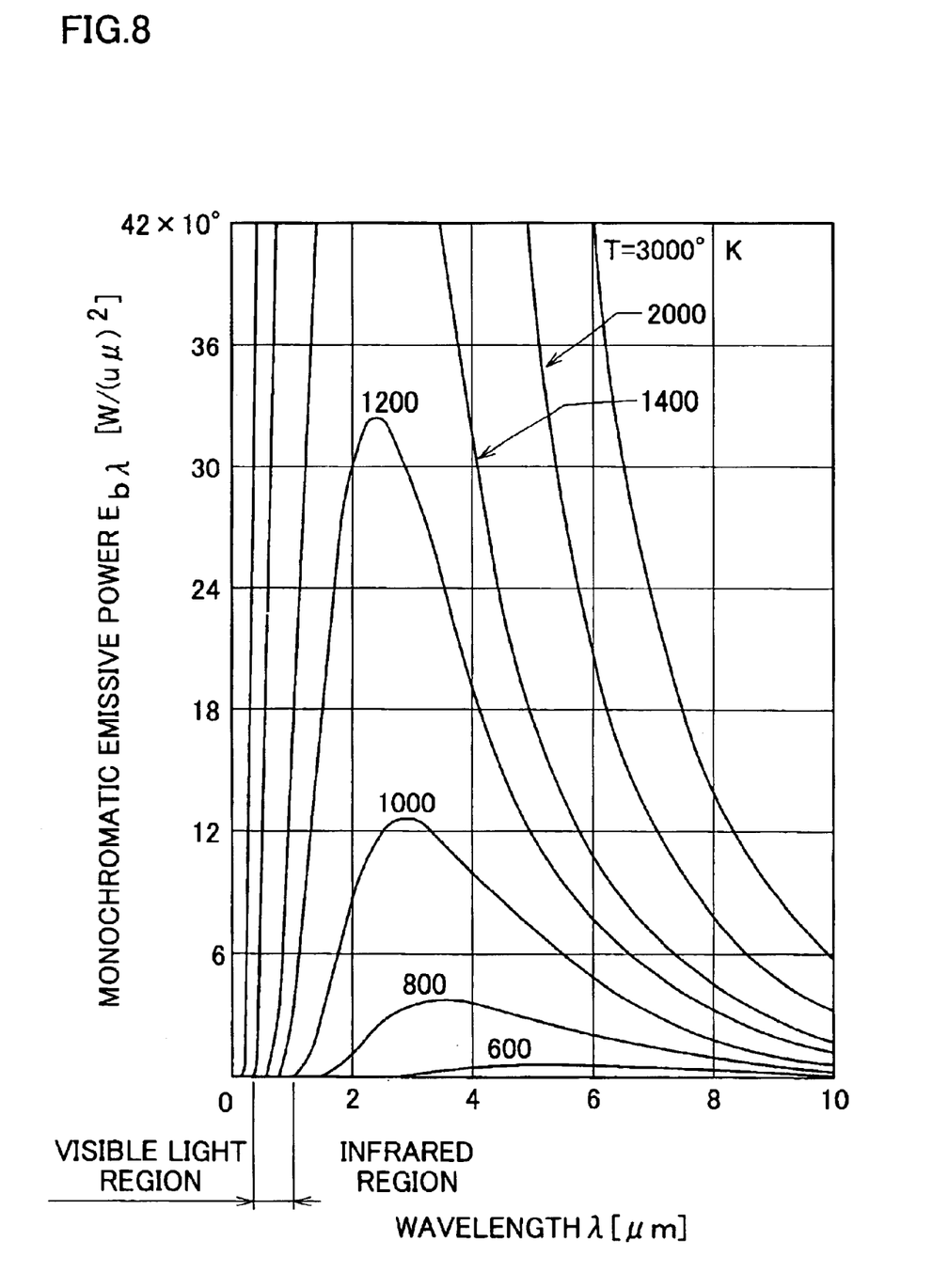
FIG. 8 is a graph showing relations between monochromatic emissive power of black body ($E_{b\lambda}$) and wavelength when absolute temperature T of object surface is varied.

The range of the wavelength band to be reflected depends on the temperature of the heat source. That is, of the radiated energies emitted from a unit area of object surface within a unit time under a predetermined temperature, the maximum limit energy is shown by monochromatic emissive power obtained from a perfect black body. This can be expressed by the equation below (Planck's Law):

$$E_{b\lambda} = A\lambda^{-5}(e^{B/\lambda T}-1)^{-1}[W/(\mu m)^2]$$

where, $E_{b\lambda}$: monochromatic emissive power of black body $[W/(\mu m)^2]$, $\lambda$: wavelength $[\mu m]$, T: absolute temperature of object surface [K], A: $3.74041 \times 10^{-16}[W \cdot m^2]$, and B: $1.4388 \times 10^{-2}[m \cdot K]$. FIG. 8 is a graph showing relations between monochromatic emissive power ($E_{b\lambda}$) and wavelength obtained when absolute temperature T of the object surface was varied. It is seen that the monochromatic emissive power peak lowers and shifts towards the longer wavelength side as T decreases.

Materials of the element reflecting layer composing the stack are preferably selected from combinations of the materials which are stable against high temperatures and capable of ensuring a necessary-and-sufficient level of difference in the refractive indices therebetween for infrared reflection. The stack can be configured so as to include a layer which comprises a semiconductor or an insulator having a refractive index of 3 or above, as the first element reflecting layer which serves as a high-refractive-index layer. Use of the semiconductor or an insulator having a refractive index of 3 or above as the first element reflecting layer facilitates to ensure a large difference in the refractive index from that of the second element reflecting layer to be combined therewith. Table 1 summarizes refractive indices of materials for the element reflecting layers applicable to the invention. Substances having refractive indices of 3 or above can be exemplified by Si, Ge and 6h-SiC, and also by compound semiconductors such as $Sb_2S_3$, BP, AlP, AlAs, AlSb, GaP and ZnTe. As for semiconductors and insulators, it is preferable to use those having band gap energies sufficiently larger (e.g., 2 eV or above) than photon energies of the heat ray, because those of the direct transition type having band gap energies close to the photon energies of the heat ray to be reflected tend to absorb the heat ray. On the other hand, those of indirect transition type (e.g., Si, Ge) can suppress the heat ray absorption at a low level and applicable to the invention in a desirable manner even if the band gap energies thereof are smaller than the above-described value. Among others, Si is advantageously used for the invention because it has a relatively low price, can readily be made in a form of a thin film, and has a refractive index of as large as 3.5. Using a Si layer as the first element reflecting layer can therefore realize a stacked structure having a high reflectivity at low costs.

Next, low-refractive-index materials for composing the second element reflecting layer can be exemplified by $SiO_2$, BN, AlN, $Al_2O_3$, $Si_3N_4$ and CN. In this case, it is necessary to select the materials for the second element reflecting layer so as to ensure a difference in the refractive index of 1.1 or more depending on the types of the materials already selected for the first element reflecting layer. Table 1 below summarizes refractive indices of these materials. Among others, adoption of $SiO_2$ layer, BN layer or $Si_3N_4$ layer is particularly advantageous in ensuring a large difference in the refractive indices. The $SiO_2$ layer has a refractive index of as small as 1.5, and can ensure a large difference from that of the first element reflecting layer typically composed of a Si layer. It is also advantageous in that it can readily be formed typically by oxidation of the Si layer. On the other hand, the BN layer has a refractive index ranging from 1.65 to 2.1 depending on the crystal structure or orientation. The $Si_3N_4$ layer has a refractive index ranging from 1.6 to 2.1 depending on quality of the film. Although these layers have slightly larger refractive indices as compared with that of $SiO_2$, they can still ensure a large difference of refractive index as much as 1.4 to 1.85 from that of Si. Considering the temperature range (400 to 1,400° C.) generally used for manufacturing of silicon wafers, it is effective, in view of efficiently reflecting the radiated heat, to compose the heat ray reflecting layer so as to essentially include a Si layer and additionally include at least either of a $SiO_2$ layer or a BN layer, and more specifically to compose it so that the Si layer and $SiO_2$ layer and/or the BN layer are included as the element reflecting layer. The BN layer is desirable when applied to ultra-high-temperature use since it has a melting point considerably higher than that of $SiO_2$. BN is also advantageous in that it can emit only $N_2$ as an outgas if decomposed at high temperatures, where boron remains in the surface in a semi-metallic state, and is thus not affective to electric characteristics of the semiconductor wafers such as Si wafer and the like. Table 2 shows exemplary combination of preferable materials by temperature zones.

TABLE 1

| Substance | Refractive index (h) | Substance | Refractive index (h) |
|---|---|---|---|
| Si | 3.5 | c-BN | 2.1 |
| 6h-SiC | 3.2 | h-BN | 1.65 |
|  |  |  | (// c-axis) |
| 3c-SiC | 2.7 |  | 2.1 |
|  |  |  | (⊥ c-axis) |
| Diamond | 2.5 | $Al_2O_3$ | 1.8 |
| $TiO_2$ | 2.5 | $SiO_2$ | 1.5 |
| AlN | 2.2 | $Sb_2S_3$ | 4.5 |
|  |  | $Si_3N_4$ | 2.1 |

Refractive Indices of Semiconductors

| Compound | Width of forbidden band [eV] 300K | Transition type | Refractive index n (hv ≅ Eg) |
|---|---|---|---|
| Si | 1.2 | indirect | 3.4 |
| Ge | 0.7 | indirect | 4.0 |
| 6h-SiC | 3.2 | indirect | 2.7 |
| h-BN |  |  | 2.1 |
| BP | 2.0 | indirect | 3.5 |
| AlN | 6.2 |  | 2.2 |
| AlP | 2.4 | indirect | 3.0 |
| AlAs | 2.2 | indirect | 3.2 |
| AlSb | 1.6 | indirect | 3.4 |
| GaN | 3.4 | direct | 2.2 |
| GaP | 2.3 | indirect | 3.5 |
| ZnS | 3.8 | direct | 2.5 |
| ZnSe | 2.7 | direct | 2.6 |
| ZnTe | 2.3 | direct | 3.2 |
| CdS | 2.4 | direct | 2.5 |

TABLE 2

| Application | Layers composing periodic structure |
|---|---|
| Low-to-middle temperature use (<1, 100° C.) | Si, $SiO_2$ |
| High-temperature use (1,100–1, 400° C.) | Si, BN |
| Ultra-high-temperature use (1,400–1, 600° C.) | SiC, BN |

Figure 1:
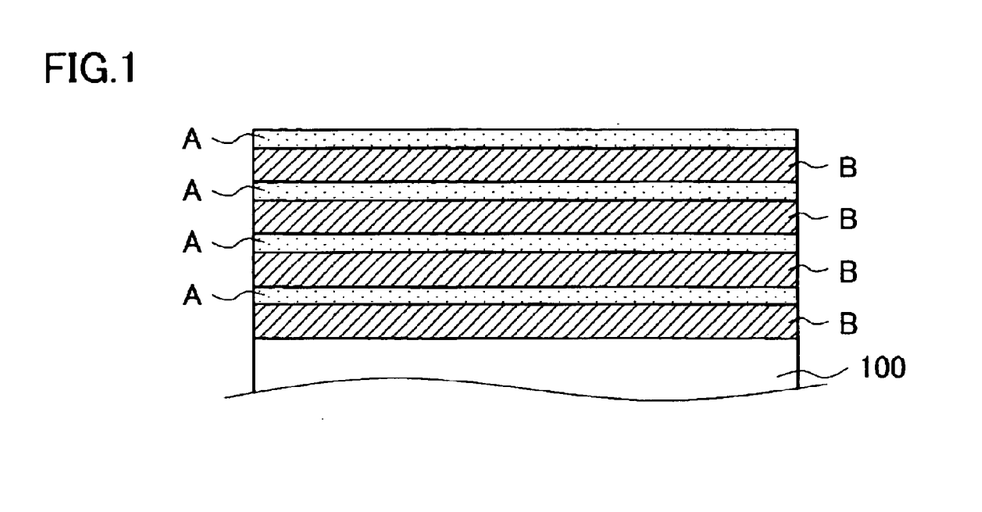
FIG. 1 is a sectional view of a heat ray reflecting material of the invention, having a 4-cycle structure of Si layers and $SiO_2$ layers.
Figure 2:
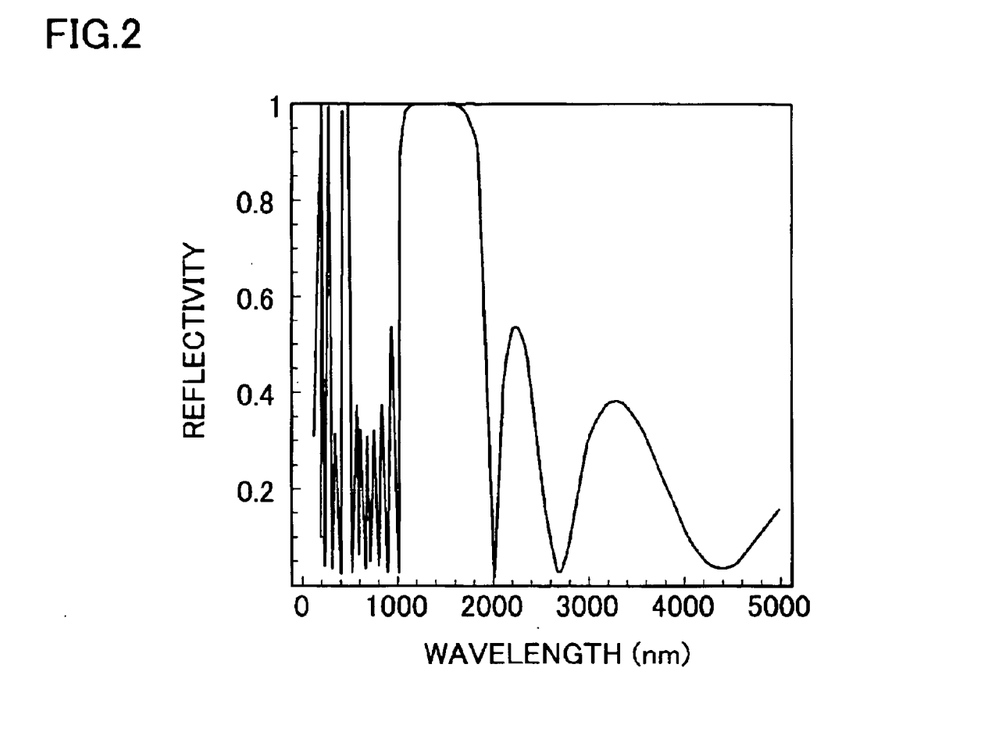
FIG. 2 is a chart showing a heat ray reflectivity characteristic of the heat ray reflecting material having the structure shown in FIG. 1.

Next paragraphs will describe results of calculative examination on conditions which can ensure an almost complete reflection of infrared region by forming an one-dimensional photonic band gap structure using Si and $SiO_2$. Si has a refractive index of approximately 3.5, and a thin film thereof is transparent to light in the infrared region having a wavelength of approximately 1.1 to 10 μm. $SiO_2$ has a refractive index of approximately 1.5, and a thin film thereof is transparent to light in the infrared region having a wavelength of approximately 0.2 to 8 μm (visible to infrared regions). FIG. 1 is a sectional view of a heat ray reflecting layer having formed on Si substrate 100, four cycles of the stack cycle units, each of which comprising two layers of a Si layer "A" of 100 nm thick and a $SiO_2$ layer "B" of 233 nm thick. This structure can achieve a reflectivity of infrared radiation in the 1 to 2 μm band of nearly 100% as shown in FIG. 2, and can inhibit transmission of the infrared radiation. It is also allowable to compose the base member with other materials (e.g., quartz ($SiO_2$)), another Si layer is formed thereon, and stack cycle unit similarly comprising two layers of a Si layer "A" and $SiO_2$ layer "B" can be formed further thereon.

Figure 3:
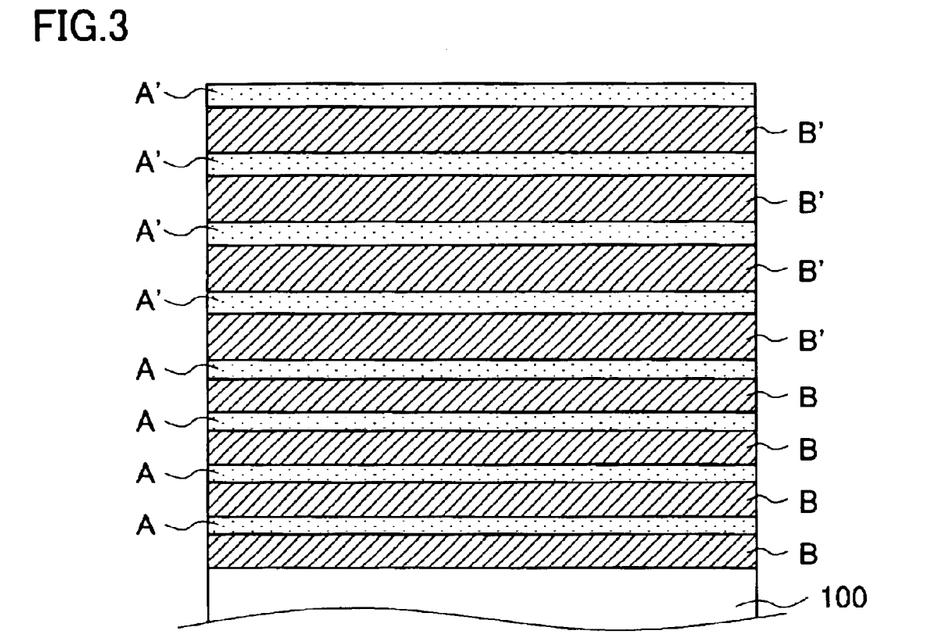
FIG. 3 is a sectional view of a heat ray reflecting material having a structure in which the 4-cycle structure shown in FIG. 1 is stacked with another 4-cycle structure of Si layers and $SiO_2$ layers having different thickness.

For example, a heat source of 1,600° C. has a maximum intensity in 1 to 2 μm band, where coverage of this band together with 2 to 3 μm band (corresponding to a peak wavelength region of heat ray spectrum obtained from a heat source of around 1,000 to 1,200° C.) is accomplished by adding another periodic combination differed in the wavelength region to be reflected. That is, an allowable configuration may be such as shown in FIG. 3, where the aforementioned combinations of 100 nm (Si)/233 nm ($SiO_2$) are added with another thickened combinations of 157 nm (Si)/366 nm ($SiO_2$) (A'/B' in FIG. 3).

Figure 4:
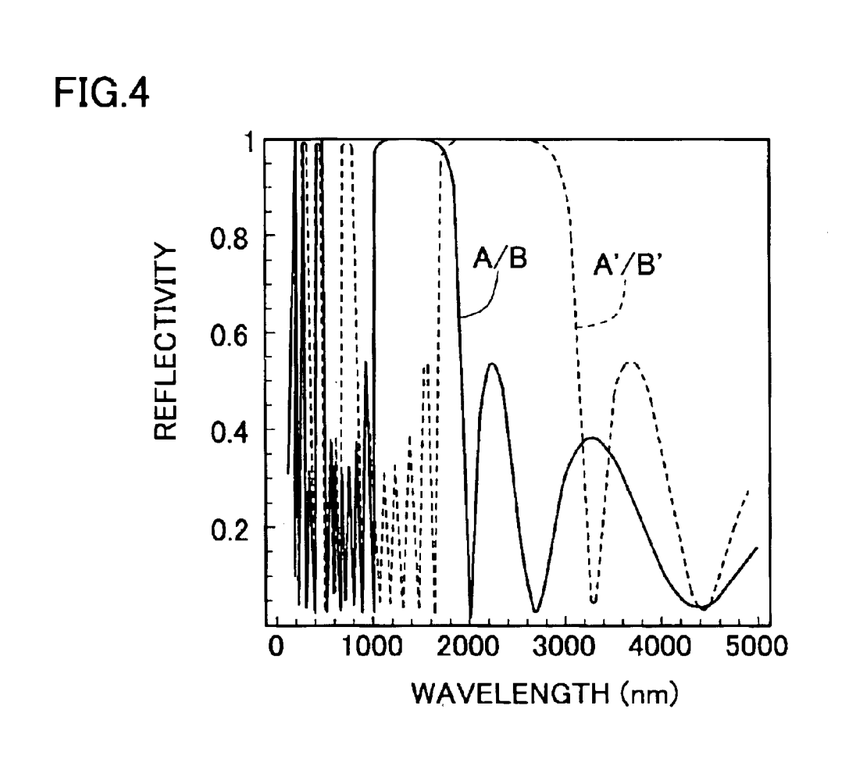
FIG. 4 is a chart showing a heat ray reflectivity characteristic of the heat ray reflecting material having the structure shown in FIG. 3.

In contrast to that the above-described 4-cycle structure of 100 nm (Si)/233 nm ($SiO_2$) ensures nearly 100% reflectivity for infrared radiation in 1 to 2 $\mu$m band, the 4-cycle structure of 157 nm (Si)/366 nm ($SiO_2$) ensures nearly 100% reflectivity for infrared radiation in 2 to 3 $\mu$m band, as shown in FIG. 4. Therefore the structure shown in FIG. 3 in which these structures are stacked can provide a material which can ensure nearly 100% reflectivity over 1 to 3 $\mu$m band.

Similarly, 3 to 4.5 $\mu$m band can be covered by properly selecting a further thickened combination of Si layer and $SiO_2$ layer and by forming the 4-cycle structure. Combination of layer only capable of ensuring a difference between the refractive indices smaller than that between Si and $SiO_2$ may need a larger number of cycles, so that a larger difference between two layers to be selected is more advantageous. According to the above-described combination, a total thickness of 1.3 $\mu$m ensures almost complete reflection of 1 to 2 $\mu$m band, and a total thickness of 3.4 $\mu$m ensures that of 1 to 3 $\mu$m band.

Figure 5:
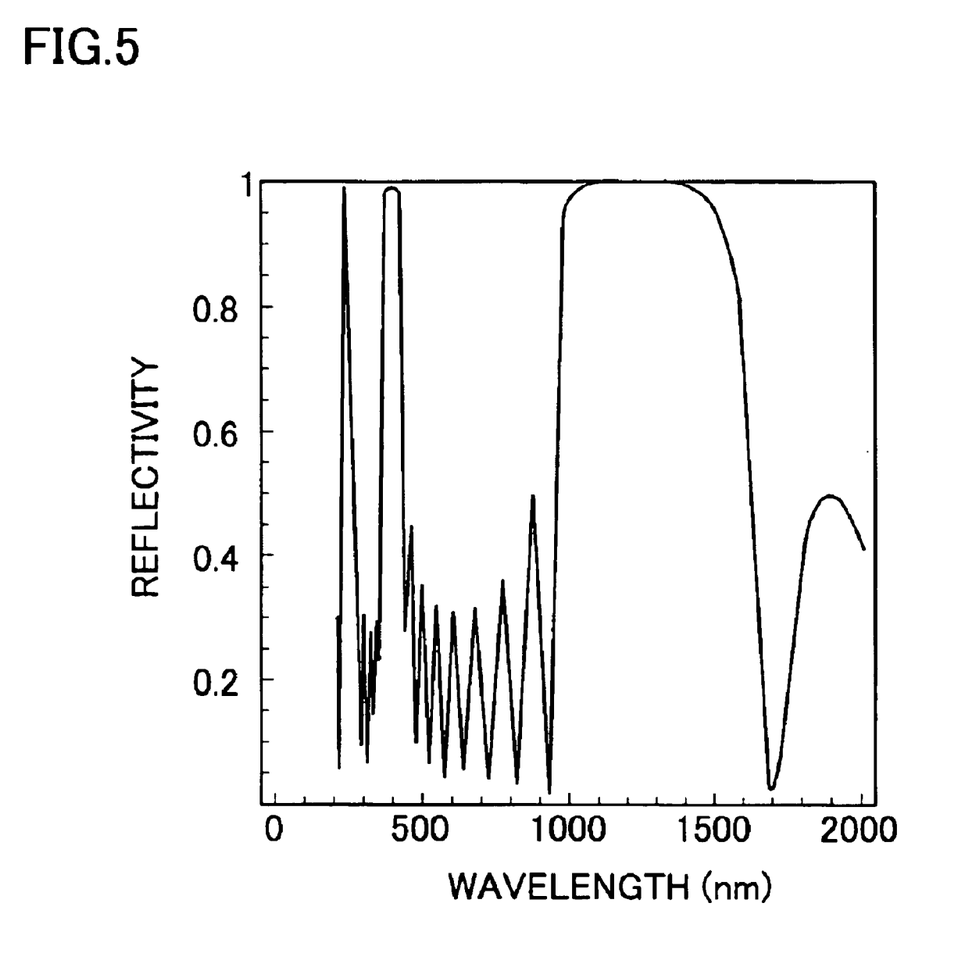
FIG. 5 is a chart showing a heat ray reflectivity characteristic of the heat ray reflecting material of the invention, having a 4-cycle structure of 6h-SiC layers and h-BN layers.

On the other hand, FIG. 5 shows a calculated result of the reflectivity of the heat ray reflecting layer having a 4-cycle structure of 94 nm (SiC)/182 nm (BN), based on selection of 6h-SiC (refractive index 3.2) and h-BN (refractive index 1.65) capable of ensuring a large difference in the refractive indices therebetween similarly to the case of Si and $SiO_2$. It is known in this case that reflectivity of nearly 100% is achieved for light (heat ray) in 1 to 1.5 $\mu$m band.

BEST MODES FOR CARRYING OUT THE INVENTION

Figure 6:
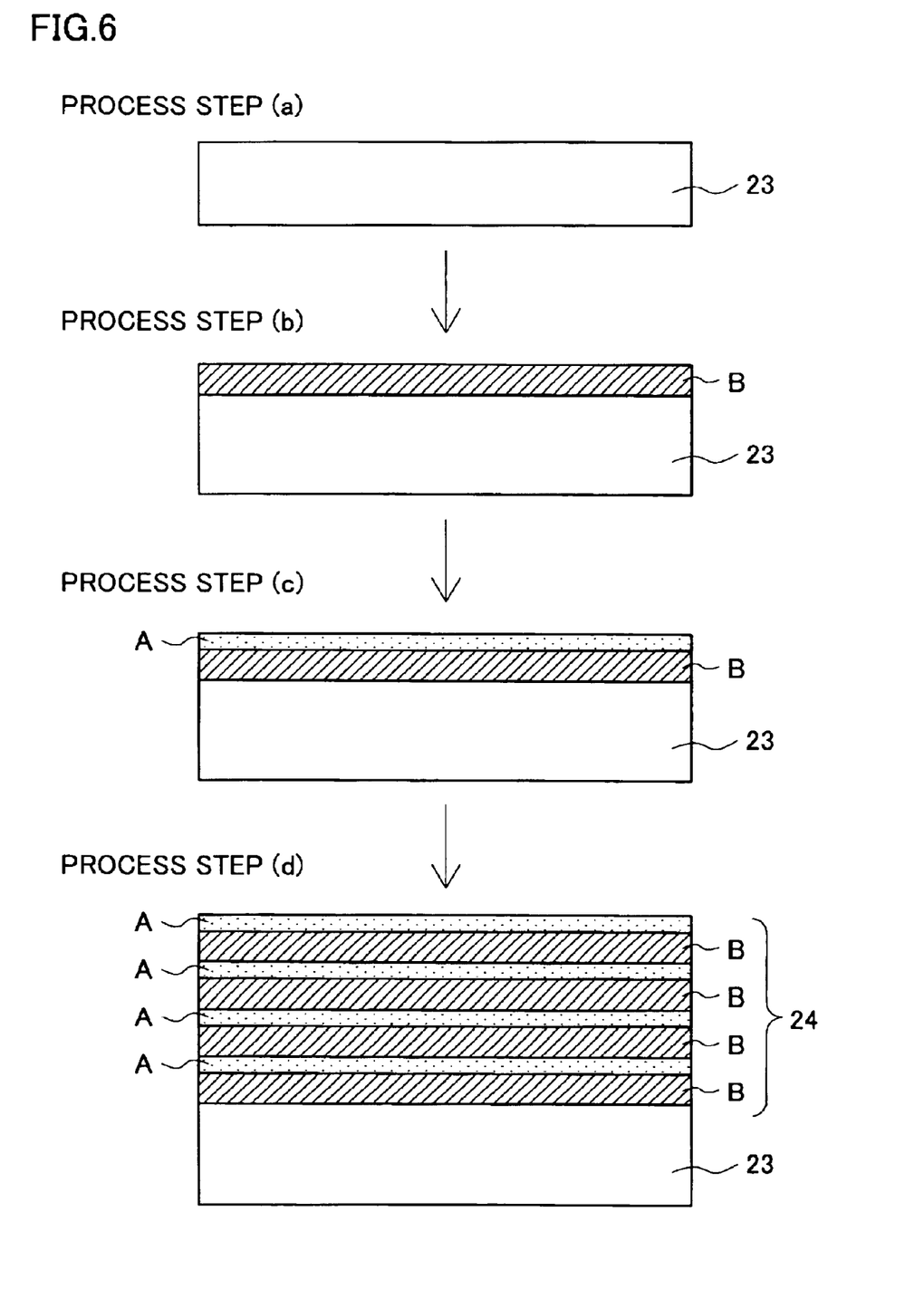
FIG. 6 is a drawing of a manufacturing process flow of the heat ray reflecting material having a periodic structure of the invention.

The following paragraphs will describe best modes for carrying out the invention, where the invention is by no means limited thereto. FIG. 6 shows a manufacturing process flow of a heat ray reflecting material 20 of the invention. First, a material for composing a base member 23 for the heat ray reflective material is selected, and the material is then processed to obtain a necessary form (process step (a) in FIG. 6).

Figure 7A:
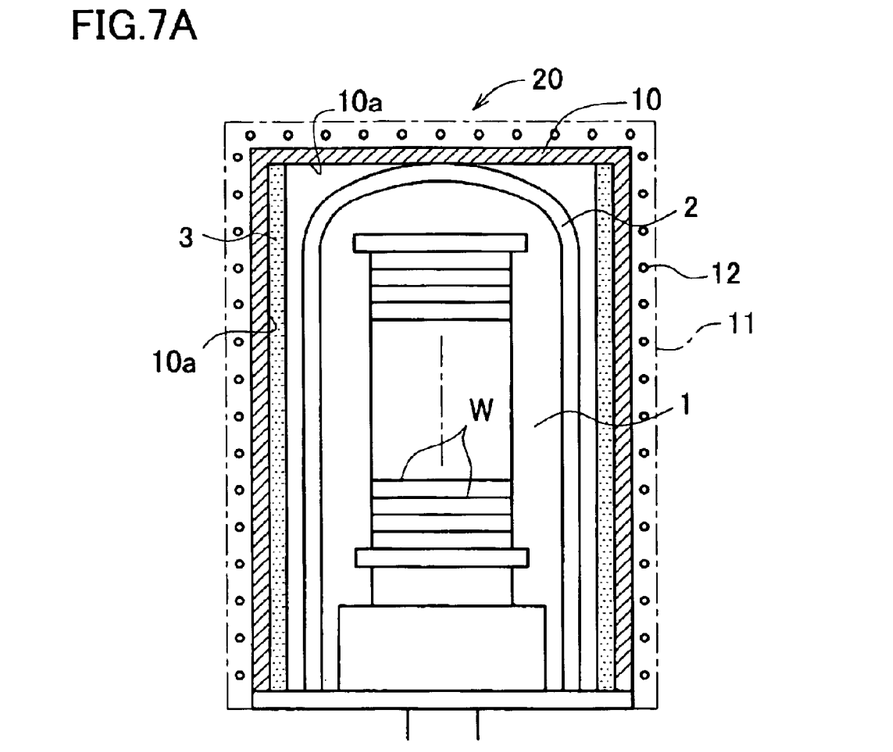
FIG. 7A is a longitudinal sectional view of a heating apparatus according to a first applied example of the heat ray reflecting material of the invention.
Figure 7B:
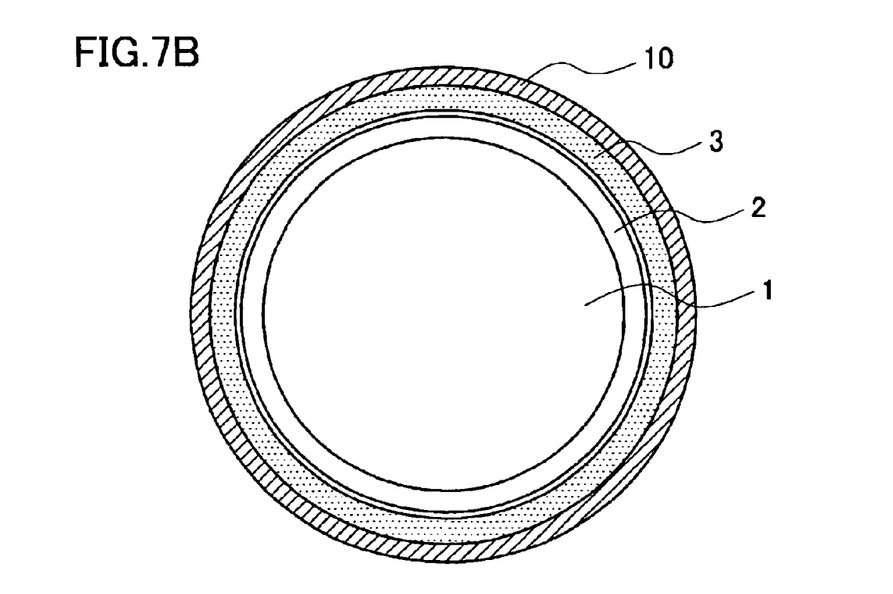
FIG. 7B is a transverse sectional view of the heating apparatus according to the first applied example of the heat ray reflecting material of the invention.

The form required herein for the base member may differ by applications of the heat ray reflecting material, and for the case intended for application to a heating apparatus (e.g., oxidation/diffusion furnace for annealing) 20 for semiconductor wafers as shown in FIGS. 7A and 7B, the base member is processed to obtain a form capable of surrounding a resistance exothermic body (heat source) 3 disposed outside a reaction tube (container) 2 having an annealing chamber (work housing space) 1. A heat ray reflecting member 10 having the heat ray reflecting material of the invention formed on the base member is, therefore, configured so as to surround the exothermic body 3 and the annealing chamber 1, and so that the surface thereof is composed of the heat ray reflecting material of the invention. Thus-configured heating apparatus 20 is such as having the reaction tube (container) 2 having the housing space 1 for housing work W formed therein; the exothermic body (heat source) 3 for heating a work (semiconductor wafer) W in the work housing space 1; and the heat ray reflecting member 10 having a heat reflecting surface 10a thereof composed of the heat ray reflecting material of the invention, so as to allow the heat ray generated in the work housing space to reflect on the heat reflecting surface 10a to thereby change the direction thereof towards the work (semiconductor wafer) W.

Any large heat conduction from the exothermic body 3 herein may raise a problem of temperature rise of the heat ray reflecting member 10 and deformation of the base member. In this case, it is preferable to provide a cooling mechanism for cooling the heat ray reflecting member 10. While the cooling mechanism may be of air-cooled type such as having a radiating member such as a fin, or such as making contact with cool air flow, this embodiment adopts a cooling mechanism of water-cooled type higher in the cooling efficiency. More specifically, as indicated by a dashed line in FIG. 7A, a structure adopted herein includes a water-cooled wall 11, having a water-cooling pathway 12 (composed of a pipe member for circulating water or a water jacket) embedded therein, and formed so as to contact with the heat ray reflecting member 10. While the heat ray reflecting member 10 and water-cooled wall 11 in this embodiment are formed as separate members, it is also possible to embed the water cooling pathway 12 in the base member of the heat ray reflecting member 10, to thereby allow the heat ray reflecting member 10 per se to have functions of the cooling mechanism.

The base member 23 shown in FIG. 6 preferably has a mechanical strength and heat resistance, where Si, $SiO_2$, SiC, BN and the like are suitable as the materials therefor. These materials are used for substrates on which semiconductor devices are fabricated, and typically for the reaction tube of general annealing apparatuses or annealing jigs or the like for annealing the substrates, have a wide versatility, and can be processed to obtain various forms.

Next, a first element reflecting layer "B" which is transparent to the heat ray emitted from the exothermic body, is formed on the surface of the base member 23 (process step (b) in FIG. 6). Thereafter, the second element reflecting layer "A", having a refractive index different from that of the first element reflecting layer "B" is formed on the surface of the first element reflecting layer "B" (process step (c) in FIG. 6). While there are no special limitations on the method of forming these layers, the CVD process can form a variety of layers such as Si, $SiO_2$, SiC, BN, $Si_3N_4$ and so forth. When the base member 23 is a Si substrate, the first layer of $SiO_2$ layer as the first element reflecting layer can be formed by thermal oxidation. Similarly, for the case where a Si layer is used as the first or second element reflecting layer, a $SiO_2$ layer as the other element reflecting layer can be formed again by the thermal oxidation.

A periodic structure 24 is then produced by forming two or more cycles of these first and second element reflecting layers, to thereby form the heat ray reflecting material 20 of the invention (process step (d) in FIG. 6). These two layers having a periodicity may be formed only on one surface or on both surfaces of the base member. The thickness and the number of cycles can be determined by calculations or experiments based on the range of wavelength band to be reflected, as can be understood from the above-described exemplary case of $SiO_2$ and Si. The range of wavelength band to be reflected depends on temperature of the exothermic body.

Figure 9:
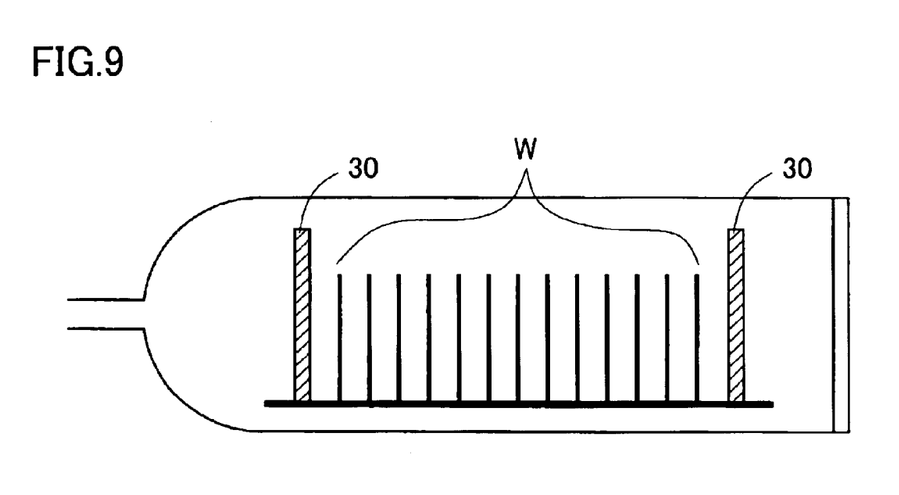
FIG. 9 is a drawing of a heating apparatus according to a second applied example of the heat ray reflecting material of the invention.

The heat ray reflecting material of the invention can inseparably be incorporated into the annealing apparatus per se, or can be used as a dummy wafer during the annealing proceeded in a conventional annealing apparatus. That is, as shown in FIG. 9, it is allowable to make heat ray reflective materials 30 of the invention in a wafer form having an almost equal shape with the semiconductor wafers W to be annealed or having a larger diameter, and to dispose them on the front and rear ends of the semiconductor wafers W aligned on an annealing boat, by which the heat ray can be reflected towards both sides of the semiconductor wafers and is prevented from dissipating, and therefore the semiconductor wafer W can efficiently be annealed.

Another embodiment will be explained below.

Figure 11:
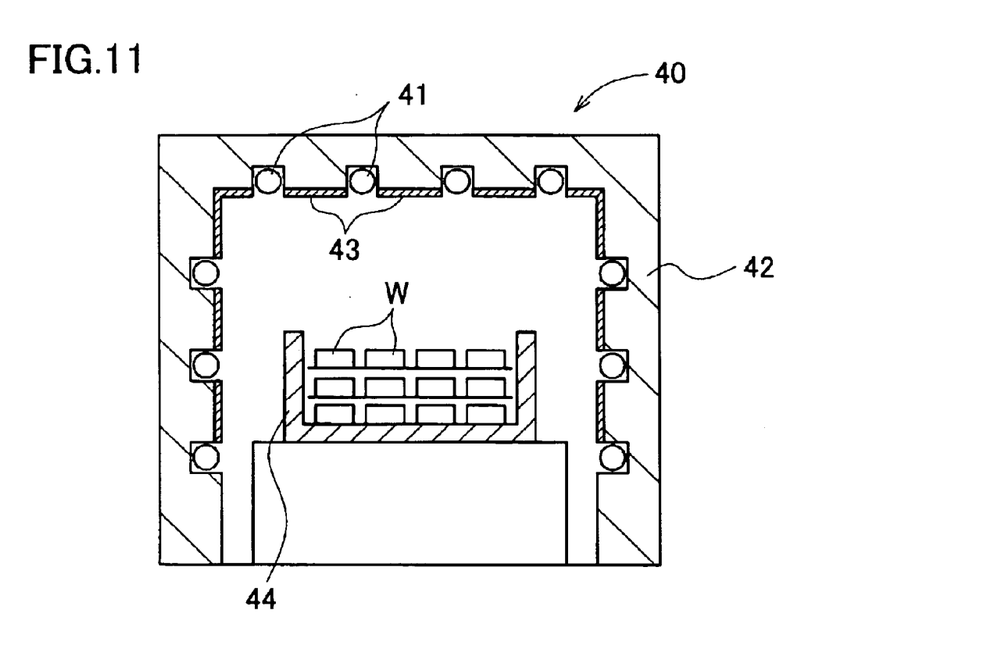
FIG. 11 is a drawing of a heating apparatus according to a third applied example of the heat ray reflecting material of the invention.

FIG. 11 shows a heating apparatus 40 used for sintering or annealing of the works W comprising a metal member or a ceramic member, where the apparatus has resistance exothermic elements 41 as heat sources inside a furnace wall member 42 composing the container. On the inner surface of the furnace wall member 42, heat ray reflecting materials 43 having the periodic structure similar to that described in the above are disposed in the space not occupied by the resistance exothermic elements 41. The heat ray reflecting materials 43 can not only concentrate the heat ray from the resistance exothermic elements 41 to the works W, but can also reflect radiated heat from the heated works W back to the works W, to thereby ensure a more efficient heating.

Figure 12:
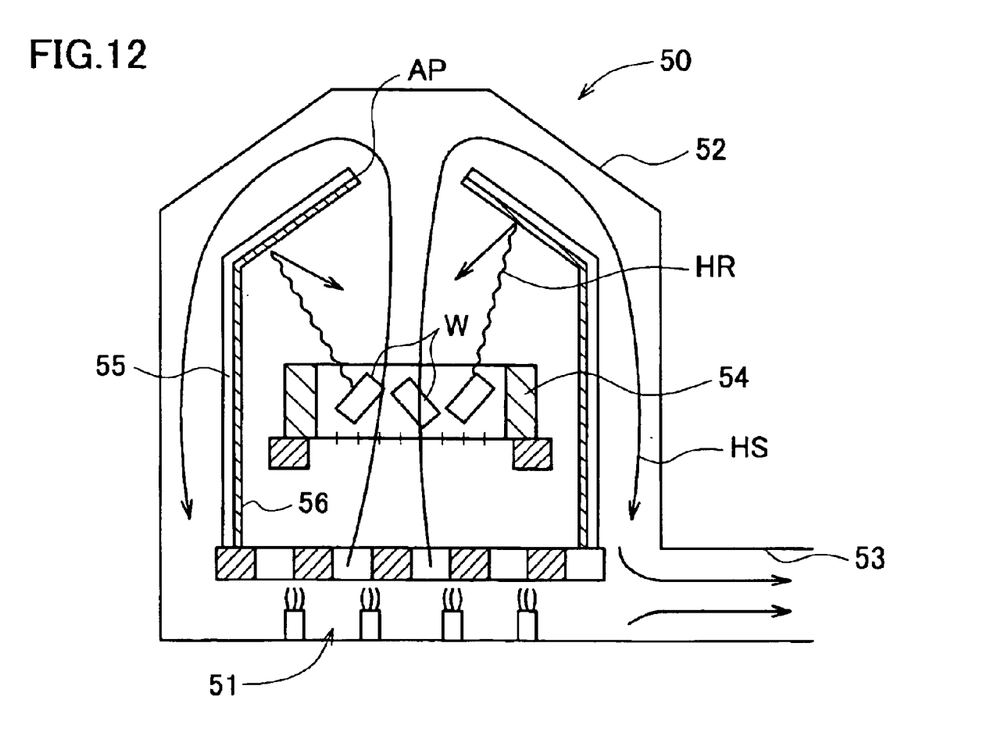
FIG. 12 is a drawing of a heating apparatus according to a fourth applied example of the heat ray reflecting material of the invention.

FIG. 12 shows a heating apparatus 50 using combustion heat sources 51 such as gas burners, where the apparatus is configured so as to dispose heat sources 51 typically at the bottom of a furnace body 52 which composes the container, and so as to allow the generated heat stream HS to circulate by convection within the furnace body 52 to thereby heat the works W. A heat ray reflecting material 56 of the invention formed on a base member 55 is disposed so as to surround the works W while keeping an aperture path AP for the convection opened. Reflection of the radiated heat from the heated works W back to the works W ensures a more efficient heating. A reference numeral 53 represents an exhaustion path for combustion gas.

Besides the above-described applications which use exothermic bodies of relatively high temperatures such as those used in manufacturing processes for semiconductors or metal materials, the heat ray reflecting material of the invention is also applicable to exothermic bodies of relatively low temperatures of several hundreds to thousand degrees centigrade. In this case, the base member on which the heat ray reflecting material is formed or a layer for composing the periodic structure may comprise a glass, paint, plastic or gas such as air.

Figure 13:
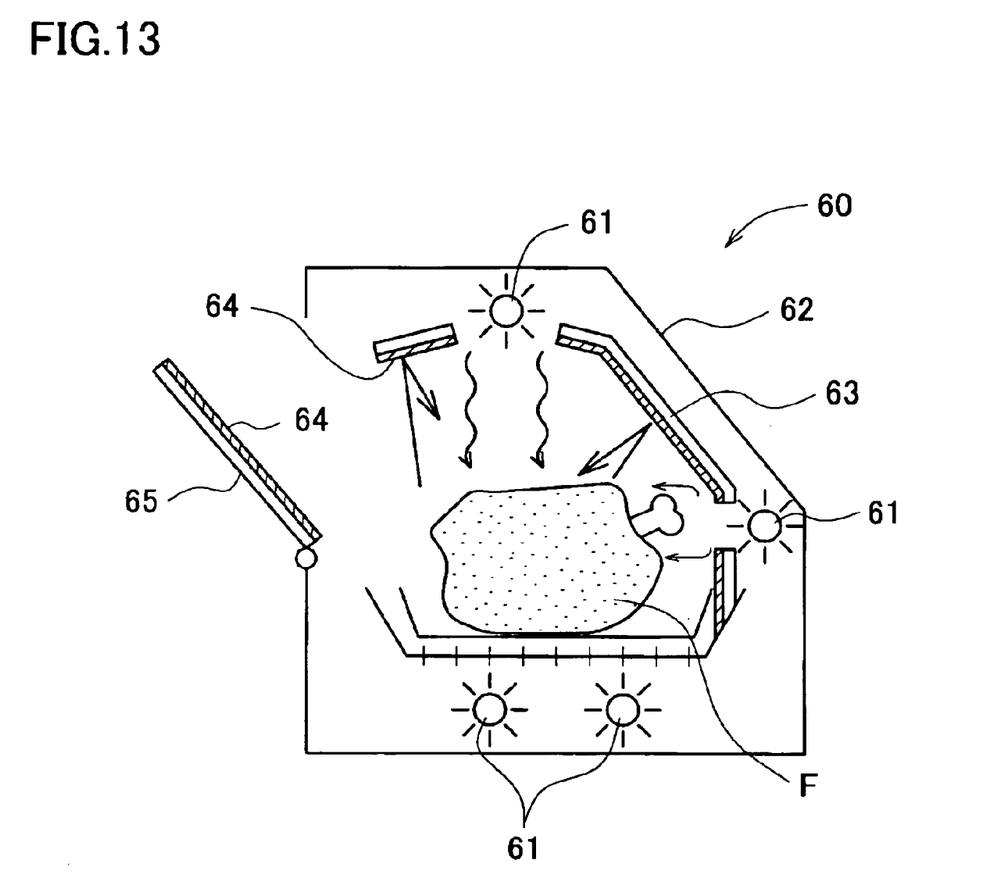
FIG. 13 is a drawing of a heating apparatus according to a fifth applied example of the heat ray reflecting material of the invention.

FIG. 13 shows a heating apparatus 60 for cooking foods applied with the invention. Heat sources 61 individually composed of a resistance heating wire or a ceramic heater are disposed on the inner surface of a container 62 having a door 65 though which a food F is put in or taken out, and a heat ray reflecting material 64 formed on a base member 63 is disposed while keeping a positional relation not interfering the heat ray directed from the heat sources 61 towards the food F (in spaces between the adjacent heat sources 61, 61 herein). The heat ray reflecting material 64 is also disposed on the inner surface of the door 65. This configuration makes it possible to efficiently concentrate the heat to the food F, and can realize a cooking heating apparatus having a low power consumption and high output power. The apparatus can heat the food F from all directions and allow the heat ray to reach deep into the food F in an efficient manner, by which a thick meat or the like can be cooked without causing non-uniformity. It is convenient herein to configure a part of the door 65 using a transparent base member such as a heat-resistant glass or the like, and to form thereon the heat ray reflecting material using $Si/SiO_2$, which are transparent to the visible light, because the food F during cooking can be observed.

EXAMPLE

The following paragraphs will describe results of experiments carried out to confirm the effects of the invention.

On a silicon wafer having a diameter of 150 mm, a thermal oxide film of 233 nm thick was formed by dry oxidation at 1,000° C. Further on the thermal oxide film, a polysilicon layer of 205 nm thick was then deposited by the reduced-pressure CVD process. The thermal oxidation was repeated again to thereby form a thermal oxide film of 233 nm thick while leaving the polysilicon layer of 100 nm thick.

Thereafter, formation of the 205-nm-thick polysilicon layer and the 233-nm-thick thermal oxide layer were repeated twice, and a polysilicon layer of 100 nm thick was finally formed to thereby form the 4-cycle structure of polysilicon layer/thermal oxide film as shown in FIG. 1. The structure was formed on both surfaces of the wafer for the convenience of the process.

Figure 10:
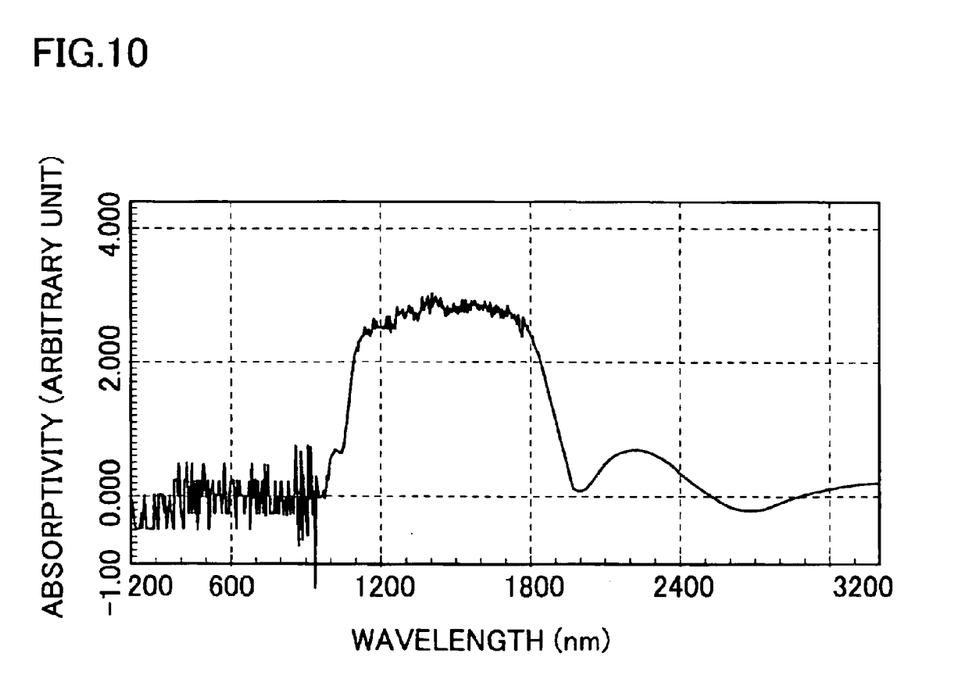
FIG. 10 is a spectral chart showing a difference spectrum of the heat ray reflecting material and a reference in an embodiment of the invention.

The wafer was irradiated with infrared radiation, and an absorption spectrum was obtained by measuring the transmitted light. For reference, an absorption spectrum of a silicon wafer having no periodic-structured layers formed thereon was measured. Difference of these spectra was obtained and shown in FIG. 10. It is found from the results shown in FIG. 10 that the absorptivity becomes high in a wavelength band ranging from approximately 1 to 2 μm (1,000 to 2,000 nm). This is ascribable to increase in the reflectivity in the 1 to 2 μm wavelength band due to the periodic structure on the wafer surface, and consequent decrease in the transmissivity of light in that wavelength band, so that the spectrum obtained in the above was such as apparently showing that the absorptivity in that wavelength band increased. This means that the wafer of the invention shows an extremely higher reflectivity of infrared radiation in the wavelength band of approximately 1 to 2 μm than the reference shows. This shows a good coincidence with the calculated result shown in FIG. 2.

What is claimed is:

1. A heat ray reflecting material capable of reflecting heat ray in a specific wavelength band, being a stack of a plurality of element reflecting layers comprising materials having transparent properties to the heat ray, wherein, in the element reflecting layers, two adjacent layers are composed of a combination of materials differed from each other in refractive indices to the heat ray, while keeping difference between the refractive indices of 1.1 or larger.

2. The heat ray reflecting material as claimed in claim 1, wherein the specific wavelength band to be reflected by the heat ray reflecting material falls within a range from 1 to 10 μm.

3. The heat ray reflecting material as claimed in claim 1, wherein the stack comprises first and second element reflecting layers differed in refractive indices and being adjacent to each other, and is configured so that stack cycle units, each of which comprising a first and a second element reflecting layers, are formed in two or more cycles on the surface of a base member.

4. The heat ray reflecting material as claimed in claim 3, wherein the stack includes a layer which comprises a semiconductor or an insulator having a refractive index of 3 or above, as the first element reflecting layer.

5. The heat ray reflecting material as claimed in claim 4, wherein the first element reflecting layer is a Si layer.

6. The heat ray reflecting material as claimed in claim 4, wherein the stack includes a layer comprising any one of $SiO_2$, BN, AlM, $Si_3N_4$, $Al_2O_3$, $TiO_2$, TiN and CN, as the second element reflecting layer.

7. The heat ray reflecting material as claimed in claim 3, wherein the first or second element reflecting layer is a Si layer, and the other element reflecting layer adjacent thereto is a $SiO_2$ layer or a BN layer.

8. The heat ray reflecting material as claimed in claim 4, wherein the number of formation cycles of the stack cycle unit is 5 cycles or less.

9. The heat ray reflecting material as claimed in claim 3, wherein the base member comprises any one of Si, $SiO_2$, SiC, EN, AlN, $Si_3N_4$, $Al_2O_3$, $TiO_2$, TiN and CN.

10. A heating apparatus comprising:
a container having a work housing space formed therein;
a heat source for heating a work in the work housing space; and
a heat ray reflecting member having a heat reflecting surface thereof composed of the heat ray reflecting material as claimed in claim 1, so as to allow the heat ray generated in the work housing space to reflect on the heat reflecting surface to thereby change the direction thereof towards the work.

11. A heating apparatus comprising at least:
an annealing chamber for carrying out annealing;
an exothermic body disposed outside the annealing chamber; and a heat ray reflecting member surrounding the exothermic body and the annealing chamber and having a heat reflecting surface thereof composed of the heat ray reflecting material as claimed in claim 1.

12. The heat ray reflecting material as claimed in claim 2, wherein the stack comprises first and second element reflecting layers differed in refractive indices and being adjacent to each other, and is configured so that stack cycle units, each of which comprising a first and a second element reflecting layers, are formed in two or more cycles on the surface of a base member.

13. The heat ray reflecting material as claimed in claim 12, wherein the stack includes a layer which comprises a semiconductor or an insulator having a refractive index of 3 or above, as the first element reflecting layer.

14. The heat ray reflecting material as claimed in claim 13, wherein the first element reflecting layer is a Si layer.

15. The heat ray reflecting material as claimed in claim 5, wherein the stack includes a layer comprising any one of $SiO_2$, BN, AlN, $Si_3N_4$, $Al_2O_3$, $TiO_2$, TiN and CN, as the second element reflecting layer.

16. The heat ray reflecting material as claimed in claim 13, wherein the stack includes a layer comprising anyone of $SiO_2$, BN, AlN, $Si_3N_4$, $Al_2O_3$, $TiO_2$, TiN and CN, as the second element reflecting layer.

17. The heat ray reflecting material as claimed in claim 12, wherein the first or second element reflecting layer is a Si layer, and the other element reflecting layer adjacent thereto is a $SiO_2$ layer or a BN layer.

18. The heat ray reflecting material as claimed in claim 7, wherein the number of formation cycles of the stack cycle unit is 5 cycles or less.

19. The heat ray reflecting material as claimed in claim 13, wherein the number of formation cycles of the stack cycle unit is 5 cycles or less.

20. The heat ray reflecting material as claimed in claim 17, wherein the number of formation cycles of the stack cycle unit is 5 cycles or less.

21. The heat ray reflecting material as claimed in claim 4, wherein the base member comprises any one of Si, $SiO_2$, SiC, BN, AlN, $Si_3N_4$, $Al_2O_3$, $TiO_2$, TiN and CN.

22. The heat ray reflecting material as claimed in claim 7, wherein the base member comprises any one of Si, $SiO_2$, SIC, BN, AlN, $Si_3N_4$, $Al_2O_3$, $TiO_2$, TiN and CN.

23. The heat ray reflecting material as claimed in claim 8, wherein the base member comprises any one of Si, $SiO_2$, SiC, BN, AlN, $Si_3N_4$, $Al_2O_3$, $TiO_2$, TIN and CN.

24. The heat ray reflecting material as claimed in claim 12, wherein the base member comprises any one of Si, $SiO_2$, SIC, BN, AlN, $Si_3N_4$, $Al_2O_3$, $TiO_2$, TiN and CM.

25. The heat ray reflecting material as claimed in claim 13, wherein the base member comprises any one of Si, $SiO_2$, SiC, BN, AlN, $Si_3N_4$, $Al_2O_3$, $TiO_2$, TiN and CN.

26. The heat ray reflecting material as claimed in claim 17, wherein the base member comprises any one of Si, $SiO_2$, SiC, BN, AlN, $Si_3N_4$, $Al_2O_3$, $TiO_2$, TiN and CN.

27. The heat ray reflecting material as claimed in claim 18, wherein the base member comprises any one of Si, $SiO_2$, SiC, BN, AlN, $Si_3N_4$, $Al_2O_3$, $TiO_2$, TiN and CN.

28. The heat ray reflecting material as claimed in claim 19, wherein the base member comprises any one of Si, $SiO_2$, SiC, BN, AlN, $Si_3N_4$, $Al_2O_3$, $TiO_2$, TiN and CN.

29. The heat ray reflecting material as claimed in claim 20, wherein the base member comprises any one of Si, $SiO_2$, SiC, BN, AlN, $Si_3N_4$, $Al_2O_3$, $TiO_2$, TiN and CN.

30. A heating apparatus comprising:

a container having a work housing space formed therein;

a heat source for heating a work in the work housing space; and a heat ray reflecting member having a heat reflecting surface thereof composed of the heat ray reflecting material as claimed in claim 3, so as to allow the heat ray generated in the work housing space to reflect on the heat reflecting surface to thereby change the direction thereof towards the work.

31. A heating apparatus comprising:

a container having a work housing space formed therein;

a heat source for heating a work in the work housing space; and a heat ray reflecting member having a heat reflecting surface thereof composed of the heat ray reflecting material as claimed in claim 4, so as to allow the heat ray generated in the work housing space to reflect on the heat reflecting surface to thereby change the direction thereof towards the work.

32. A heating apparatus comprising:

a container having a work housing space formed therein;

a heat source for heating a work in the work housing space; and a heat ray reflecting member having a heat reflecting surface thereof composed of the heat ray reflecting material as claimed in claim 7, so as to allow the heat ray generated in the work housing space to reflect on the heat reflecting surface to thereby change the direction thereof towards the work.

33. A heating apparatus comprising:

a container having a work housing space formed therein;

a heat source for heating a work in the work housing space; and a heat ray reflecting member having a heat reflecting surface thereof composed of the heat ray reflecting material as claimed in claim 8, so as to allow the heat ray generated in the work housing space to reflect on the heat reflecting surface to thereby change the direction thereof towards the work.

34. A heating apparatus comprising:

a container having a work housing space formed therein;

a heat source for heating a work in the work housing space; and a heat ray reflecting member having a heat reflecting surface thereof composed of the heat ray reflecting material as claimed in claim 18, so as to allow the heat ray generated in the work housing space to reflect on the heat reflecting surface to thereby change the direction thereof towards the work.

35. A heating apparatus comprising at least:

an annealing chamber for carrying out annealing; an exothermic body disposed outside the annealing chamber; and a heat ray reflecting member surrounding the exothermic body and the annealing chamber and having a heat reflecting surface thereof composed of the heat ray reflecting material as claimed in claim 12.

36. A heating apparatus comprising at least:

an annealing chamber for carrying out annealing; an exothermic body disposed outside the annealing chamber; and a heat ray reflecting member surrounding the exothermic body and the annealing chamber and having a heat reflecting surface thereof composed of the heat ray reflecting material as claimed in claim 13.

37. A heating apparatus comprising at least:

an annealing chamber for carrying out annealing; an exothermic body disposed outside the annealing chamber; and a heat ray reflecting member surrounding the exothermic body and the annealing chamber and having a heat reflecting surface thereof composed of the heat ray reflecting material as claimed in claim 17.

38. A heating apparatus comprising at least:

an annealing chamber for carrying out annealing; an exothermic body disposed outside the annealing chamber; and a heat ray reflecting member surrounding the exothermic body and the annealing chamber and having a heat reflecting surface thereof composed of the heat ray reflecting material as claimed in claim 19.

39. A heating apparatus comprising at least:

an annealing chamber for carrying out annealing; an exothermic body disposed outside the annealing chamber; and a heat ray reflecting member surrounding the exothermic body and the annealing chamber and having a heat reflecting surface thereof composed of the heat ray reflecting material as claimed in claim 20.

* * * * *

UNITED STATES PATENT AND TRADEMARK OFFICE
CERTIFICATE OF CORRECTION

PATENT NO. : 6,815,645 B2
DATED : November 9, 2004
INVENTOR(S) : Takao Abe

It is certified that error appears in the above-identified patent and that said Letters Patent is hereby corrected as shown below:

Column 11,
Line 46, delete "AlM" and substitute therefore -- AlN --.
Line 57, delete "EN" and substitute therefore -- BN --.

Column 12,
Line 25, delete "anyone" and substitute therefore -- any one --.
Lines 46 and 52, delete "SIC" and substitute therefore -- SiC --.
Line 49, delete "TIN" and substitute therefore -- TiN --.
Line 52, delete "CM" and substitute therefore -- CN --.

Signed and Sealed this

Twenty-fourth Day of May, 2005

JON W. DUDAS
*Director of the United States Patent and Trademark Office*